INVENTOR.
DAVID F. HILBIBER
BY
ATTORNEYS

INVENTOR.
DAVID F. HILBIBER
BY Edgar L. Borony
Stuart Lubitz
ATTORNEYS 3,366,802
FIELD EFFECT TRANSISTOR PHOTOSENSITIVE MODULATOR (PHOTO-CHOPPER)

David F. Hilbiber, Los Altos, Calif., assignor to Fairchild Camera and Instrument Corporation, Syosset, N.Y., a corporation of Delaware Filed Apr. 6, 1965, Ser. No. 445,901
8 Claims. (Cl. 307—251)

ABSTRACT OF THE DISCLOSURE

A photosensitive semiconductor device having at least one diffused region of one conductivity type in a semiconductor body of the opposite conductivity type. The diffused region forms a channel and a PN junction with the semiconductor body having a depletion layer incident thereto which imparts a given resistance to the channel. The diffusion depth of the diffused region is selected so that the depletion layer extends to the surface of the device in the absence of applied light to the device. The device also requires a source and drain for supplying and removing current as well as a means for applying light to the channel to reduce the channel resistance. The device is capable of large changes in channel resistance by application of relatively small amounts of energy.

This invention relates to a semiconductor photosensitive device and in particular to a device that may be efficiently switched at rates in excess of 1 kc. between resistances that differ by at least three orders of magnitude. Such a device is particularly advantageous in modulator or chopper circuits, that is circuits for modifying an AC current or for converting a DC current to an AC current. At the outset it should be understood that photosensitive, light-sensitive and similar expressions refer to devices which have altered characteristics when exposed to light. The term light includes not only visible electromagnetic radiation but also infrared, ultraviolet, X-ray and other wavelength radiation.

Prior art photosensitive devices may be generally divided into four main classes: (1) photoemissive cells; (2) photoconductors; (3) photovoltaic cells; and (4) reverse biased junction devices such as photodiodes, field effect transistors, or phototransistors. In general, photoemissive cells take the form of vacuum or gas filled diodes with their cathodes coated with a photoemissive material such as silver, boron or cesium. Such cathodes respond to incident light by emitting electrons in accordance with the expression $E=hf-w$, where E is the energy of the emitted electron, $h$ is Planck's constant, $f$ is the frequency of the incident light and $w$ is the work function of the photoemissive material.

The second class of devices, photoconductors, are essentially light sensitive conductors or resistors which may take the form of thin films of light sensitive materials such as cadmium sulfide, lead sulfide or cadmium selenide deposited on a substrate and fitted at the ends with electrodes. In these devices, incident light increases the number of charge carriers and increases the conductance of the resistor. The physical process by which this takes place is intrinsic excitation and impurity excitation.

The final two classes of devices, photovoltaic cells and reverse biased junction devices, utilize the properties of the photovoltage generated by photon-induced hole-pairs in the vicinity of the junction. Photovoltaic cells generally have a large area and are used as power generators, such as a solar cell, although they may also take the form of photodiodes. Reverse biased junction devices, such as phototransistors, use the carriers injected into the base region for transistor action with the injected carriers arising from the photovoltage induced in the forward-bias direction at the emitter-base junction.

The above devices have a number of distinct disadvantages when employed in electro-optical systems. The sensitivity of the phototransistor, or photovoltaic cells have a relatively low sensitivity as compared to photoconductors or photomultipliers. The sensitivity of a photomultiplier which includes a photoemissive cell is offset by its relative instability, complexity, bulkyness, and critical power and shielding requirements. The photoconductor is temperature sensitive, experiences a shelf deterioration, exhibits extreme batch variations, is shape and spectral sensitive, and is slow in response. In the last respect photoconductors commonly require several milliseconds to change resistance by a factor of 100 with a given incident light level. It is possible to increase the light level for faster rise times, but this results in an unduly early failure of the light source. In sealed systems which include light sources and sensors, this is tantamount to failure of the unit. The response of the phototransistor is better than the photoconductor but it has the disadvantage of a relatively large offset voltage since the emitter-base and collector-base junctions are of considerably different area, impurity concentration, and depth.

The purpose of this invention is to overcome the disadvantages of prior art photosensors and provide a simple, reproducible sensor which provides a large change of resistance with modest changes of illumination. The invented device accomplishes these goals by employing a principle that is not clearly employed by any of the above-listed classes of photosensors. This device uses a semiconductor channel which forms a PN junction with another semiconductor region and has a source and drain connected thereto. There is no external bias applied to the PN junction but the device aproaches a pinch-off condition because of internally generated voltages. The conductance of the channel is modulated by applying light which alters the normally pinched-off space charge region or depletion layer associated with the PN junction. The alteration of the PN junction depletion layer in turn modulates the channel conductance through which current passes by varying the cross-sectional area of the conductivity path. This is a substantially different physical principle than that employed in photoconductors, photoemissive cells, phototransistors, photovoltaic cells, or biased field effect devices. It can properly best be described as a type of device employing a photovoltaic effect and a field effect. As a result of combining these effects, advantages are obtained heretofore unattainable. A photosensitive device employing the principle of the invention has an R-off/R-on (i.e., off-resistance to on-resistance) ratio of at least a thousand-to-one; such a change is attainable in a hundred microseconds or less at relatively low illumination levels. Light triggered switching rates of greater than 1 kc. have been easily attained. The device is temperature stable between −55° C. to 125° C. and stable throughout its life in various environmental conditions. In addition, the device has the following advantages; low offset voltage; fabrication by well developed and reliable silicon planar techniques; batch insensitivity; and a sensitivity improvement with respect to certain faster photoconductors.

A chopper or modulating circuit incorporating the invented device has additional desirable characteristics. In such a circuit a very small transient voltage spike is seen that is smaller by nearly 5 orders of magnitude than is obtained in a circuit using the conventional electrically driven transistor chopper. The switching of the device by a light source permits an isolation of the output signal from the modulating source, and provides noise isolation. The ratio of "off" to "on" impedance is such that a very high conversion efficiency is readily attained, at high chopping rates.

Other advantages as well as the specific details of the structure of the invented device will be understood with reference to the drawings, in which.

Figure 1:
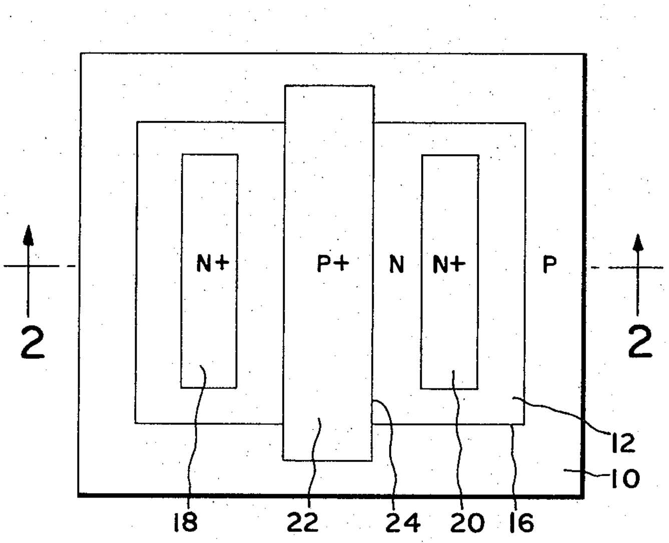
FIG. 1 is a plan view of the invented photosensitive device.
Figure 2:
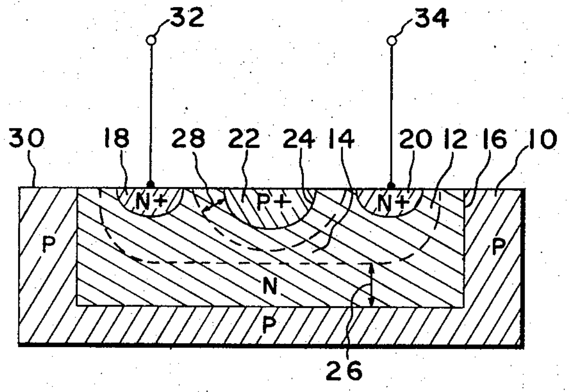
FIG. 2 is an elevation sectional view taken along the lines 2—2 of FIG. 1.
Figure 3:
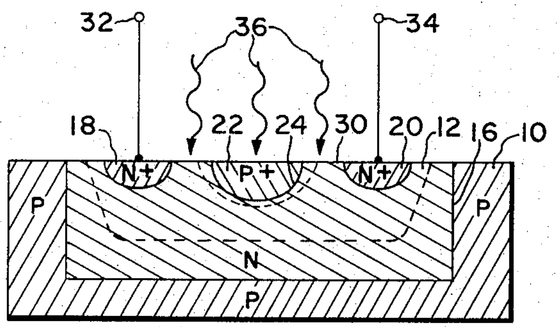
FIG. 3 is a sectional view similar to that shown in FIG. 2 and additionally showing the effect of incident light on the invented device.

Referring to FIGS. 1–3, the invented photosensitive device comprises a first semiconductor region 10 having a first conductivity type, and a second semiconductor region 12 having an opposite conductivity type located adjacent first semiconductor region 10 to form a channel 14 and a PN junction 16. A source 18 and drain 20, which have the same conductivity type as the region 12, are located along the channel 14 and define a means for connecting an input current to channel 14 and producing an output current therefrom. A third semiconductor region 22 having a conductivity type the same as the first semiconductor region 10 and opposite to the second semiconductor region 12 is located intermediate source 18 and drain 20 and adjacent second semiconductor region 12 to form a PN junction 24.

A depletion layer 26 forms as a result of PN junction 16 and a depletion layer 28 is formed as a result of the PN junction 24. With no external bias and little or no illumination on the channel region 14 and first semiconductor region 22, the depletion layers approach a pinched-off condition. The depth and concentrations of semiconductor regions 10, 12 and 22 are selected so that the depletion layers 26 and 28 normally approach a pinch-off condition as a result of internally generated voltages. A typical example of depth and concentrations which lead to this result are as follows: The junction 26 has a nominal depth of $2.5\mu$, while the junction 16 has a nominal depth of 1.8 to $2.0\mu$. The bulk impurity concentration is nominally $3\times10^{16}$ cm.$^{-3}$ (p-type), the channel has an impurity concentration of nominally $3\times10^{15}$ cm$^{-3}$. (N-type) and the diffused upper gate has a surface concentration of approximately $10^{20}$ cm.$^3$ (P-type).

In a specific embodiment of the invention the device shown in FIGS. 1–3 may employ a monocrystalline semiconductor wafer of silicon having P-type impurity 30 as boron, aluminum, gallium or indium to form the first semiconductor region 10. The second semiconductor region 12 is formed by well known epitaxial deposition techniques, or by diffusing an N-type impurity such as phosphorous, arsenic or antimony into P-type region 10 by well known photo-engraving and diffusion techniques. Such techniques are disclosed in "Microelectronics" edited by Edward Keonjian, pp. 267–295, McGraw-Hill Book Co., Inc. (1963). Following the formation of second semiconductor region 12, third semiconductor region 22 may be formed by similar diffusion and photo-engraving techniques followed by the formation of source 18 and drain 20. The source 18 and drain 20 may alternatively be formed after the diffusion of second semiconductor region 12.

The semiconductor portion of the invention is encapsulated in a housing (not shown) that protects the semiconductor regions and that permits light to pass through it and strike at least part of region 10. Typically, the housing may be transparent or have a transparent window in the vicinity of region 22. Such structures are shown in U.S. Patent 2,999,940 issued to A. Hoffman et al. on Sept. 12, 1961, and U.S. Patent 2,898,474 issued to R. F. Rutz on Aug. 4, 1959.

With the above-described structure in mind, the operation of the invented device can readily be understood by reference to FIGS. 2 and 3. With no light incident upon the invented device, as shown in FIG. 2, the depletion layers 26 and 28 will normally pinch-off or approach a pinch-off condition modulating the resistance of channel 14 so that it normally has a very high resistance, such as $10^8$ ohms. With this resistance and a given voltage source connected to terminals 32 and 34, the source 18 will supply only a negligible amount of current to the drain 20. When light represented by arrows 36 in FIG. 3 strikes surface 30, it creates electronhole pairs reducing the width of depletion layers 26 and 28. The reduction in the width of the depletion layers reduces the resistance of channel 14 by at least a factor of $10^{-3}$, commonly $10^{-4}$ or more at reasonable illuminations. With the resistance of channel 14 substantially reduced, the voltage source (not shown) connected to terminals 32 and 34 will result in a substantial current flow through channel 14 and to output terminal 34.

The switching from a high resistance to a low resistance, commonly referred to as the turn-on time, has been accomplished in about 10 to 100 microseconds. The time required for channel 14 to go from a low resistance to a high resistance, commonly referred to as the turn-off time, has been measured at $10^{-3}$ seconds. This turn-off time is determined by the charge stored near the junction and the discharge time of the gate-channel capacitance. The speed of this discharge may be increased by shunting the gate-channel junction, that is, connecting a resistor between the terminal 32 and the semiconductor region 22, such as a 4–10 mega-ohm resistor, which alters the RC constant and enables a more rapid discharge of the gate capacitance. Alternately, a means of carrier lifetime control such as gold impurities, may be included in the semiconductor region 22 to form recombination centers. With the addition of recombination centers, it is possible to attain switching times in the order of 10–100 microseconds. With a shunt resistor, turn-off times of 200 microseconds are easily attainable. Thus it can be seen that switching rates at well over 1 kc. are easily obtained.

A photosensitive device fabricated in accordance with this invention has been tested as compared to a typical photoconductor. The invented device has a significant sensitivity advantage relative to certain faster photoconductors and reverse biased field effect devices. Sensitivity as defined relates to the light intensity (e.g., $\mu$w./cm.$^2$) required to obtain the nominal "on" sheet resistivity (e.g., ohm/square). The device "on" resistance is then determined by the number of squares of surface that receives incident light. With regard to photoconductors, the advantage of the invented device lies in the much smaller area, and the lower light intensity required for a given "on" resistance. As compared to prior art reverse biased field effect devices, the device is not leakage current limited. This enables lower light intensities to be converted by a simpler structure.

The offset voltage of the device is less than $10^{-5}$ volts with a $dV_{p.ffsef/dt}$ less than ½ microvolt/degree centigrade. Through an operating range of —55° C. to 125° C. the invented device has maintained good efficiency. In addition to this temperature stability, there is little if any deterioration in different operating environments or over a long period of time in storage. All of these advantages may be accomplished with silicon planar technology and utilized in microminiature devices.

Figure 4:
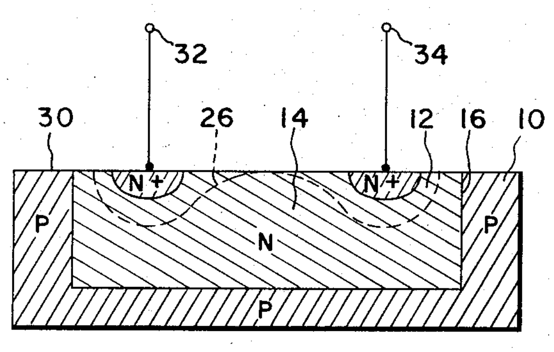
FIG. 4 is a sectional elevation view of an alternate embodiment of the invention similar to the one shown in FIGS. 1–3 with the surface gate structure eliminated.
Figure 5:
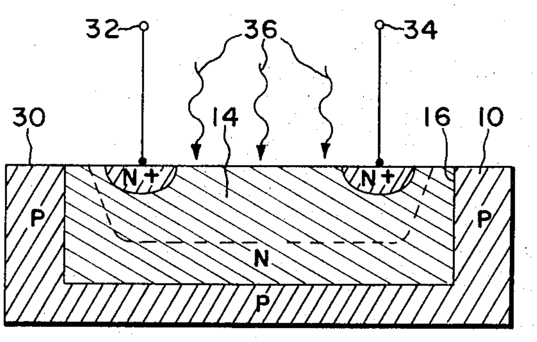
FIG. 5 shows the effect of incident light on the embodiment shown in FIG. 4.

An alternate embodiment of the invention is shown in FIGS. 4 and 5. This embodiment of the invention is identical with the one shown in FIGS. 1–3 with the exception that the third semiconductor region 22 of the first embodiment is eliminated and the PN junction 16 formed between first semiconductor region 10 and second semiconductor region 12 is so proportioned that depletion layer 26 extends to surface 30. The depletion layer 26 can be so formed by providing a shallow junction 16 typically in the range of 0.2 to 0.5 micron from the surface 30. Such shallow junctions may be formed by outdiffusion techniques such as is described in U.S. patent application Ser. No. 201,599 filed June 11, 1962 (now U.S. Patent 3,183,128), assigned to the same assignee as this invention.

The operation of the embodiment shown in FIGS. 4 and 5 is essentially the same as the embodiment of FIGS. 1–3. Briefly, a current is supplied to terminal 32. Without significant illumination on incident surface 30, the depletion layer 26 extends to surface 30 and only a negligible current will flow through channel 14 to output terminal 34. When light, as indicated by arrows 36, is incident upon surface 30, the depletion layer 26 will be reduced and a relatively large current ($10^3$–$10^5$ greater than will flow when the "on" resistance is present) will flow between input terminal 32 and output terminal 34. It should be noted that this embodiment eliminates the process steps of forming region 22 of the first embodiment. This embodiment has the additional advantage of being simpler and more sensitive to radiation of the shorter wavelengths, since the depletion layer 26 extends to the surface 30 where ultraviolet radiation is most effective.

Figure 6:
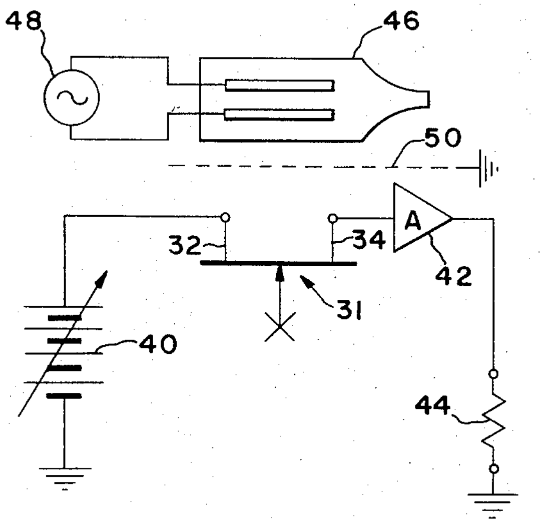
FIG. 6 is a schematic diagram of a chopper arrangmement incorporating the invented device.

The device of this invention, when incorporated into a chopper circuit, provides an advantageous arrangement. As shown in FIG. 6, the photosensitive device 31 is indicated as a field effect transistor with a floating gate or no electrical connection to the gate. DC source means 40 is connected in circuit with the photosensitive device for supplying a direct current to the input terminal 32. The output terminal 34 is connected to an amplifier means 42 for amplifying the output current from terminal 34. The amplifier 42 is in turn connected to load 44. A light source means, such as neon bulb 46, which is energized by an alternating current source 48, is located adjacent the photosensitive device 31. An electrostatic shield 50 is positioned intermediate the neon bulb 46 and the photosensitive device.

In operation, neon bulb 46 is turned on and off by energizing means 48 and in turn switches the photosensitive device on and off. This on and off switching of the photosensitive device converts the direct current supplied by DC source 40 to alternating current supplied to output terminal 34 and to the amplifier 42 which in turn energizes the load 44.

The use of the photosensitive device in a chopper or modulator circuit has a number of distinct and independent advantages. The photosensitive device is completely isolated from the modulating source, which in this case is the neon bulb 46 and the alternating current source 48. The switching of the photosensitive device on and off by incident light creates very little if any noticeable transient effects. This is particularly important when the photosensitive device is coupled to an amplifier as it minimizes the possibility of amplifier damage. Direct current can readily be converted to alternating current having a frequency over 1 kc. The ratio of the "on" impedance of the photosensitive device to the impedance of the amplifier is typically in the vicinity of 1:100 with the "off" impedance in the vicinity of a 100:1 ratio. This ratio of impedances provides high conversion efficiency.

In summary, a novel and advantageous photosensitive device has been achieved along with a chopper or modulator which incorporates this device. The device is stable, reliable, simple, easy to manufacture, and has fast response. The chopper circuit is isolated from the noise of the modulating device, incorporates a substantially transient-free switching operation, and utilizes a switching device that is matched to an amplifier for efficient operation.

While the above detailed description has shown the fundamental novel features of the invention as applied to a preferred embodiment, it will be understood that various omissions, substitutions and changes may be made by those skilled in the art without departing from the spirit and scope of the invention. It is the intention, therefore, to be limited only as indicated by the following claims.

What is claimed is:

1. A photosensitive semiconductor device, comprising:
- a first semiconductor region having a first conductivity type;
- a second semiconductor region located adjacent said first region having an opposite conductivity type;
- a third semiconductor region having the same conductivity type as said first region and located adjacent said second region, said second region having a portion forming a resistive channel between said first and third regions, and the second region disposed between respective PN junctions formed with said first and third regions defining the sides of said channel, including a depletion layer incident to each of said junctions, said depletion layers having portions approaching each other to achieve a pinch-off condition or overlapping each other within said channel in the absence of light applied to said channel;
- a source means located along said channel for supplying a current thereto;
- a drain means displaced from said source means along said channel for providing an output current, said source means and drain means comprising a semiconductor region having the same conductivity type as said second region; and
- light source means for applying light to said channel to alter the depletion layers and reduce the resistance of said channel, whereby an improved photosensitive semiconductor device is provided capable of high switching rates from a given resistance to values differing by at least three orders of magnitude.

2. The photosensitive semiconductor device of claim 1 further defined by the addition of a resistor coupled to said source means and said third semiconductor region, said resistor rendering said photosensitive semiconductor device capable of high switching rates from a given resistance to resistance values differing from said given resistance by at least three orders of magnitude.

3. The photosensitive semiconductor wafer of claim 1 further defined by the addition of an encapsulating housing for protecting the semiconductor regions, said housing permitting light to pass through it and impinge upon said channel.

4. A photosensitive crystalline semiconductor wafer comprising:
- a first region of one conductivity type;
- a second region of the opposite conductivity type located adjacent the first region and forming a PN junction therewith extending throughout the area between said first and second regions and including a depletion region incident thereto, said second region having spaced source and drain electrode portions defining a resistive channel therebetween with the channel having an exposed surface, said depletion layer extending, in the absence of light applied thereto, through and across said resistive channel to an area forming a portion of said exposed surface between said electrode portions; and
- light source means for applying light to said channel in the area between the source and drain electrode portions for reducing the extent of said depletion layer to a locale below the surface of said channel and simultaneously reducing the resistance of the channel by at least a factor of $10^{-3}$.

5. The photosensitive crystalline semiconductor wafer of claim 4 further defined by said depletion layer normally approaching a pinch-off condition without external biasing.

6. The photosensitive crystalline semiconductor device of claim 4 further defined by the addition of a means for altering the lifetime of carriers associated with said PN junction.

7. The photosensitive crystalline semiconductor wafer of claim 4 further defined by the addition of an encapsulating housing which protects the semiconductor wafer, yet permits light to pass through and strike at least said channel in the area between the source and drain electrode portions.

8. The photosensitive semiconductor device of claim 7 further defined by the addition of:

a DC source means for applying a direct current in circuit with said photosensitive device, and said light source means being adapted to apply pulsating light to said photosensitive device to periodically reduce the extent of its depletion layer and thereby periodically reduce its resistance; and amplifier means in circuit with said photosensitive device for receiving an alternating current from the drain of said photosensitive semiconductor device and for supplying an amplified AC current, whereby DC current is converted to AC current.

References Cited

UNITED STATES PATENTS

| | | | |
|---|---|---|---|
| 2,644,852 | 7/1953 | Dunlap | 317—235 |
| 2,648,805 | 8/1953 | Spenke et al. | 317—235 |
| 3,004,168 | 10/1961 | Emeis | 317—235 |
| 3,018,391 | 1/1962 | Lindsay et al. | 317—235 |
| 3,023,321 | 2/1962 | Isabeau | 317—235 |
| 3,051,840 | 8/1962 | Davis | 307—88.5 |
| 3,230,398 | 1/1966 | Evans et al. | 317—235 |
| 3,230,428 | 1/1966 | Evans | 317—234 |

JAMES D. KALLAM, *Primary Examiner.*